United States Patent
Chang et al.

(10) Patent No.: US 7,334,169 B2
(45) Date of Patent: Feb. 19, 2008

(54) GENERATION OF TEST MODE SIGNALS IN MEMORY DEVICE WITH MINIMIZED WIRING

(75) Inventors: Young-Uk Chang, Suwon-Si (KR); Gil-Shin Moon, Suwon-Si (KR); Dong-Ho Hyun, Suwon-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 398 days.

(21) Appl. No.: 11/151,053

(22) Filed: Jun. 13, 2005

(65) Prior Publication Data

US 2006/0059398 A1 Mar. 16, 2006

(30) Foreign Application Priority Data

Sep. 10, 2004 (KR) ............... 10-2004-0072472

(51) Int. Cl.
 *G01R 31/28* (2006.01)
(52) U.S. Cl. ................ 714/718; 714/30; 702/120
(58) Field of Classification Search .............. None
 See application file for complete search history.

(56) References Cited

U.S. PATENT DOCUMENTS

| | | | |
|---|---|---|---|
| 6,343,048 B1 | 1/2002 | Jung | 365/233 |
| 6,484,280 B1* | 11/2002 | Moberly | 714/726 |
| 2003/0131296 A1* | 7/2003 | Park et al. | 714/727 |
| 2005/0005217 A1* | 1/2005 | Whetsel | 714/727 |
| 2005/0283692 A1* | 12/2005 | Whetsel | 714/726 |

OTHER PUBLICATIONS

Japanese Patent No. JP2000251497 to Masaaki et al, having Publication date of Sep. 14, 2000 (w/ English Abstract page).
Japanese Patent No. JP 2002230996 to Seiji, having Publication date of Aug. 16, 2002 (w/ English Abstract page).

* cited by examiner

*Primary Examiner*—Cynthia Britt
*Assistant Examiner*—Steven D. Radosevich
(74) *Attorney, Agent, or Firm*—Monica H. Choi

(57) ABSTRACT

A memory device includes a plurality of test mode signal generating units and a plurality of test circuits. Each test mode signal generating unit generates a respective test mode signal for a respective test circuit. The test mode signal generating units generate the test mode signals in series for the test circuits. Each test mode signal generating unit may be disposed within a respective test circuit such that wiring is not necessary from the source of the test mode signals to the test circuits.

20 Claims, 3 Drawing Sheets

GENERATION OF TEST MODE SIGNALS IN MEMORY DEVICE WITH MINIMIZED WIRING

BACKGROUND OF THE INVENTION

This application claims priority to Korean Patent Application No. 2004-72472, filed on Sep. 10, 2004, in the Korean Intellectual Property Office, the disclosure of which is incorporated herein in its entirety by reference.

1. Field of the Invention

The present invention relates generally to memory devices, and more particularly, to generation of test mode signals for testing a memory device with minimized wiring.

2. Description of the Related Art

Recently, test circuits are included in a memory device to detect defects within the memory devices early so that such defects may be corrected. However, the addition of test circuits to a memory device increases the size of the memory device. The test circuits also require an increase in the number of internal signal buses, thereby further increasing the size of the memory device.

When the memory device is put into a test mode by the test circuits, the memory device stops normal operations and performs a testing operation. As the operating speed of a memory device increases, signal margin is reduced with a conventional method of setting the memory device in the test mode. In addition, the memory device may not be able to enter the test mode when operating at high speed.

FIG. 1 shows a block diagram of a conventional test mode signal generating circuit in a memory device. Referring to FIG. 1, the conventional test mode signal generating circuit includes an address decoding circuit 13 to generate test mode signals. When a command signal indicates via a command pin 11 that the memory device is to operate in a test mode, the address decoding circuit 13 generates a plurality of test mode signals 14 (TMRS1, TMRS2, . . . , and TMRSj) based on address information input via address pins 12 (Addr0, Addr1, . . . , and Addri). Each of the generated test mode signals 14 are transmitted to a respective one of test circuits 15 (CKT1, CKT2, . . . , and CKTj). The test circuits 15 perform testing in the memory device using the test mode signals 14.

FIG. 2 shows a block diagram of another conventional test mode signal generating circuit in a memory device. The test mode signal generating circuit of FIG. 2 includes a stage decoding circuit 26 in addition to the elements included in FIG. 1. To generate more test mode signals in FIG. 2 than in FIG. 1, the stage decoding circuit 26 in FIG. 2 generates signal type information indicating the types of test mode signals to be generated based on address information input via address pins 22 (Addr0, Addr1, . . . , and Addri). An address decoding circuit 23 generates the test mode signals 24 (TMRS1, TMRS2, . . . , and TMRSk) in response to the signal type information received from the stage decoding circuit 26 and the address information from the address pins 22.

Both of the test mode signal generating circuits of FIGS. 1 and 2 require address decoding circuits to generate the test mode signals. In other words, test commands are decoded differently according to input addresses, and test mode signals corresponding to the respective addresses are generated.

The test mode signal generating circuits of FIGS. 1 and 2 require bus lines to transmit the generated test mode signals to corresponding test circuits 15 or 25. Since an address decoding method is used, the number of test mode signals is determined by the number of addresses. The test mode signal generating circuit of FIG. 2 is different from the test mode signal generating circuit of FIG. 1 in that the former can generate a large number of test mode signals regardless of the number of addresses.

However, they are the same in that both require bus lines to transmit the generated test mode signals. Since the conventional test mode signal generating circuits of FIGS. 1 and 2 require numbers of bus lines equal to the numbers of generated test mode signals, the size of a memory device including one of the test mode signal generating circuits increases accordingly.

Further, the test mode signal generating circuits of FIGS. 1 and 2 require a process of latching an address decoded signal using a normal clock signal of the memory device. In that case, a sufficient margin between the address decoded signal and the normal clock signal is required. However, when the memory device operates at high speed, the margin between the address decoded signal and the normal clock signal is reduced. In particular, in the case of a high speed memory device, such as those recently developed, it is not easy to determine whether a test mode signal is set properly with respect to the high speed clock signal of the memory device.

SUMMARY OF THE INVENTION

Accordingly, testing is performed in a memory device of the present invention with minimized wiring and sufficient signal margin.

In a general aspect of the present invention, a memory device includes a plurality of test mode signal generating units and a plurality of test circuits. Each test mode signal generating unit generates a respective test mode signal for a respective test circuit. The test mode signal generating units generate the test mode signals in series for the test circuits.

In another embodiment of the present invention, each test mode signal generating unit is disposed within a respective test circuit.

In a further embodiment of the present invention, the plurality of test mode signal generating units includes a first test mode signal generating unit that generates a respective test mode signal from a test mode setting signal and a test mode latch clock signal. In addition, the plurality of test mode signal generating units includes at least one subsequent test mode signal generating unit that generates a respective test mode signal from a previous test mode signal and the test mode latch clock signal.

In another embodiment of the present invention, a test mode entry signal generator generates a test mode entry signal for indicating that the memory device operate in a test mode in response to address and command signals. In addition, an input controller generates a test mode latch clock signal and a test mode setting signal when the test mode entry signal indicates that the memory device operate in the test mode. In that case, the test mode signal generating units generate the test mode signals in response to the test mode latch clock signal and the test mode setting signal.

In a further embodiment of the present invention, the input controller includes a first switch for switching the test mode setting signal from a first input pin to the test mode signal generating units when the test mode entry signal indicates that the memory device operate in the test mode. Furthermore, the input controller includes a second switch for switching the test mode latch clock signal from a second input pin to the test mode signal generating units when the test mode entry signal indicates that the memory device operate in the test mode.

In this manner, the test mode signals are generated within each test circuit such that wiring is not necessary from the source of the test mode signals to the test circuits. Such minimized wiring reduces the area of the memory device that may be fabricated as a semiconductor integrated circuit. In addition, use of a separate test mode clock signal with longer cycles ensures sufficient signal margin.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, and 5 refer to elements having similar structure and/or function.

DETAILED DESCRIPTION OF THE INVENTION

Figure 1:
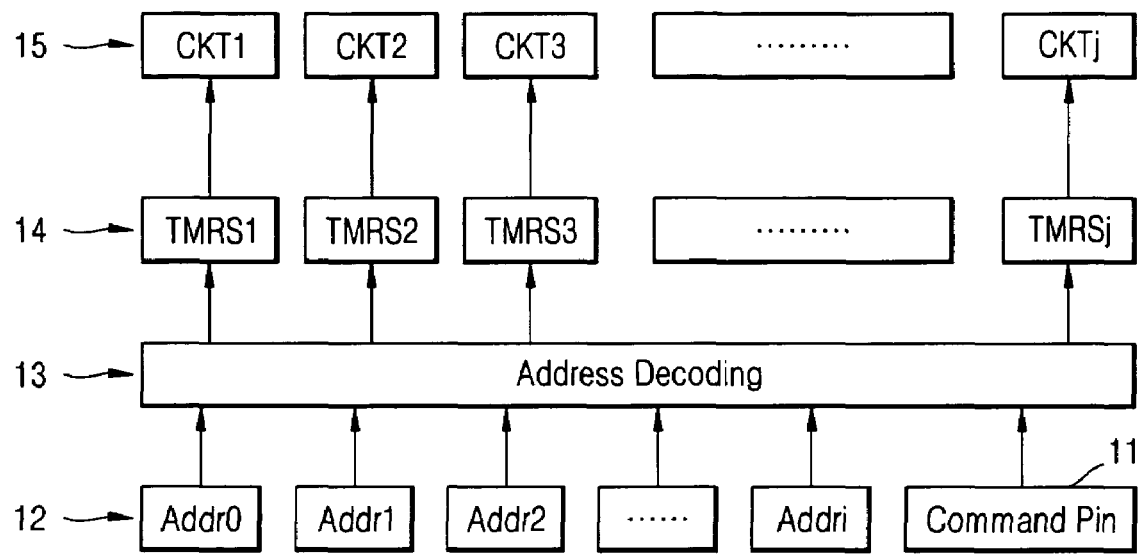
FIG. 1 is a block diagram of a conventional test mode signal generating circuit.
Figure 2:
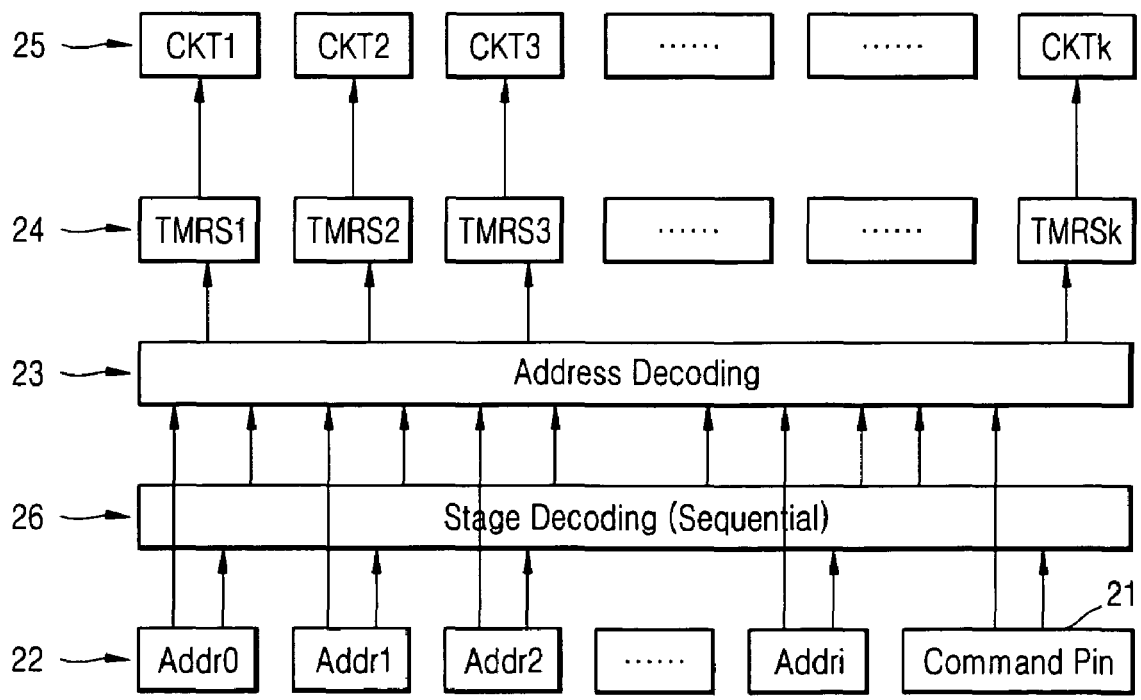
FIG. 2 is a block diagram of another conventional test mode signal generating circuit.
Figure 3:
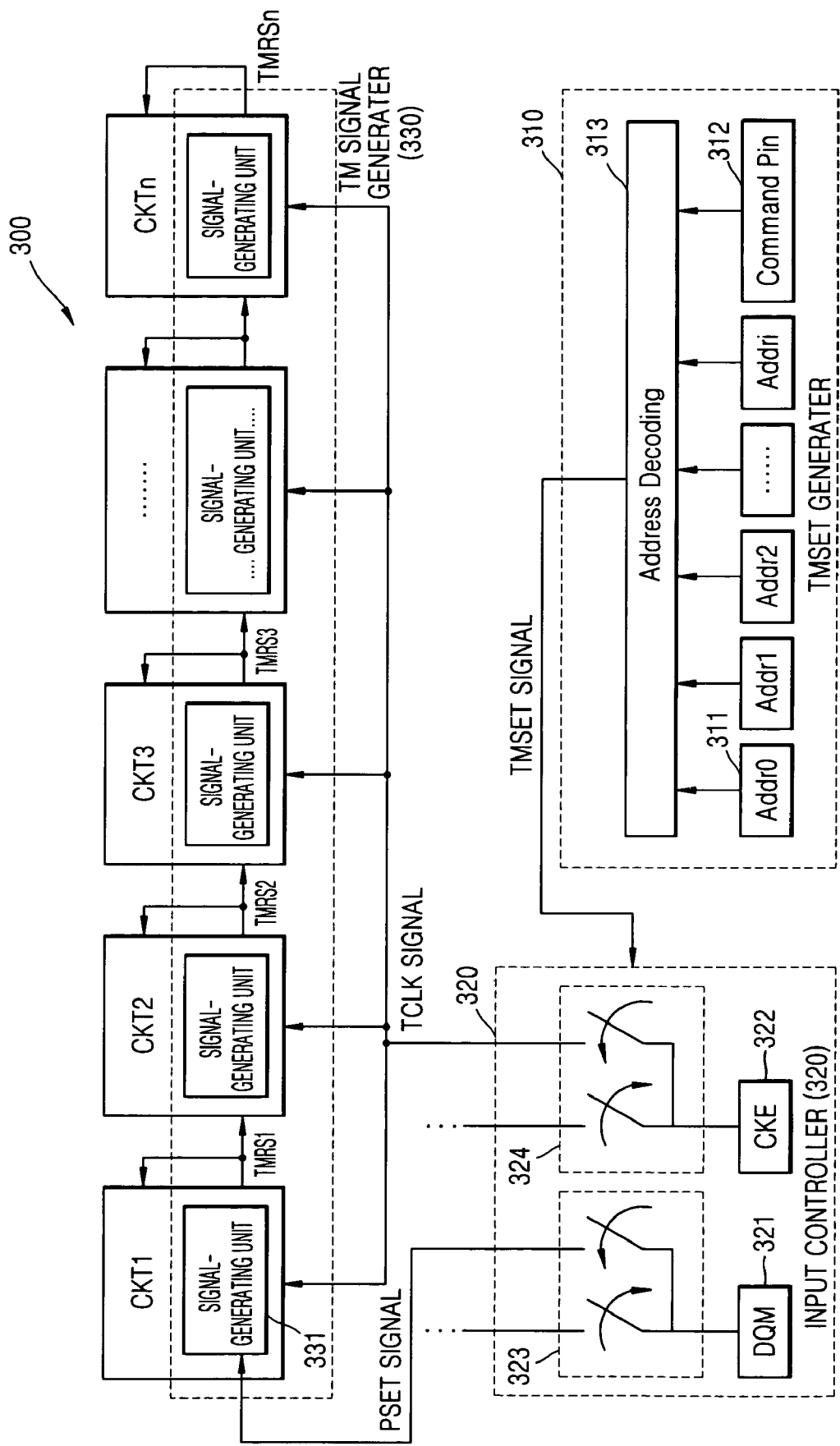
FIG. 3 is a block diagram of a test mode signal generating circuit for minimized wiring according to an embodiment of the present invention.

FIG. 3 is a block diagram of a test-mode signal generating circuit 300 in a memory device according to an embodiment of the present invention. Referring to FIG. 3, the test-mode signal generating circuit 300 includes a test mode entry signal (TMSET signal) generator 310, an input controller 320, and a test mode (TM) signal generator 330.

The TMSET signal generator 310 includes a plurality of address input units 311 (Addr1, Addr1, Addr2, . . . , and Addri), a command signal input unit 312, and an address decoding unit 313. The address input units 311 and the command signal input unit 312 are pins of the memory device in one embodiment of the present invention. The address decoding unit 313 generates a TMSET signal in response to address information input through the address input units 311 and a command signal input through the command signal input unit 312.

In other words, the address decoding unit 313 generates only the TMSET signal, unlike a conventional address decoding unit, which generates test mode signals corresponding to address information. The TMSET signal is transmitted to the input controller 320 and indicates that the memory device is to operate in a test mode thereby setting the memory device in the test mode.

The input controller 320 includes two external signal input units 321 and 322 and first and second switches 323 and 324 for switching signals received at the external signal input units 321 and 322. The external signal input units may be signal input pins of the memory device that are not frequently used. In the present embodiment, the external signal input units are a DQM input unit 321 and a CKE input unit 322.

In response to the TMSET signal, the first switch 323 does not transmit a DQM signal received at the DQM input unit 321 to an original DQM signal input circuit (not shown), but instead, transmits the DQM signal to the test mode signal generator 330 as a test mode setting (PSET) signal. In other words, when the memory device operates in a normal mode, the first switch 323 switches the DQM signal to the original DQM signal input circuit. However in the test mode, the first switch 323 switches the DQM signal to the test mode signal generator 330 as the PSET signal for testing purposes.

In response to the TMSET signal, the second switch 324 does not transmit a CKE signal received at the CKE input unit 322 to an original CKE signal input circuit (not shown), but instead, transmits the CKE signal to the test mode signal generator 330 as a test mode latch clock (TCLK) signal. In other words, when the memory device operates in the normal mode, the second switch 324 switches the CKE signal to the original CKE signal input circuit. However in the test mode, the second switch 324 switches the CKE signal to the test mode signal generator 330 as the TCLK signal for testing purposes.

The PSET signal is transmitted to the TM signal generator 330 such that the TM signal generator 330 generates first through nth test mode signals TMRS1 through TMRSn. The TCLK signal is a clock signal for synchronizing signals and operations of the memory device in the test mode.

When the TMSET signal is activated, the TCLK signal from the CKE input unit 322 is switched to the test mode signal generator 330, and the PSET signal from the DQM input unit 321 is switched to the test mode signal generator 330. The present invention may also be practiced when the external signal input units used in the input controller 320 are signal input pins other than the DQM and CKE input units 321 and 322. In general, the TM signal generating circuit 300 uses a pin for receiving the TCLK signal used to latch the first through $n^{th}$ test mode signals TMRS1 through TMRSn and another pin for receiving the PSET signal in order to generate the first through $n^{th}$ test mode signals TMRS1 through TMRSn.

The TM signal generator 330 includes a plurality of test mode signal generating units 331 connected to a plurality of test circuits (CKT1, CKT2, CKT3, . . . , and CKTn). In one embodiment of the present invention, each test mode signal generating unit 331 is disposed within a respective test circuit. In the embodiment of FIG. 3, the test mode signal generating units 331 are coupled in series.

Each test mode signal generating unit 331 generates a respective test mode signal TMRSs in response to the TCLK signal, and the PSET signal or the previous TM signal TMRS(x−1) generated by a preceding signal generating unit 331. The TCLK signal from the input controller 320 is input by all of the signal-generating units 331, and the PSET signal from the input controller 320 is input to a first one (i.e., the left most one in FIG. 3) of the test mode signal generating units 331.

Thus, the first test mode signal generating unit 331 to which the PSET signal is transmitted generates the first test mode signal TMRS1 from the PSET signal and the TCLK signal. The first test mode signal TMRS1 is transmitted to a second test mode signal generating unit 331 subsequent to the first test mode signal generating unit 331 in the series connection.

Then, the second test mode signal generating unit 331, which receives the first test mode signal TMRS1, generates the second test mode signal TMRS2 from the first test mode signal TMRS1 and the TCLK signal. The second test mode signal generating unit 331 transmits the second test mode signal TMRS2 to the third test mode signal generating unit 331 subsequent to the second test mode signal generating unit 331 in the series connection.

In general, each subsequent test mode signal generating unit 331 after the first test mode signal generating unit 331 generates a test mode signal TMRSs from a previous test mode signal TMRS(x−1) received from a previous test mode signal generating unit and the TCLK signal. In this manner, the test mode signals TMRS1 through TMRSn are generated sequentially through the series of the test mode signal generating units 331.

Unlike a conventional test mode signal generating circuit, the address decoding unit 313 of the TM signal generating circuit 300 does not directly generate the test mode signals TMRS1 through TMRSn. Instead, the address decoding unit 313 just generates the TMSET signal indicating that the memory device is to operate in the test mode such that the test mode signal generating units 331 are controlled to generate the test mode signals TMRS1 through TMRSn.

Thus, wiring is minimized since bus lines are not required for transmitting the test modes signals TMRS1 through TMRSn from the address decoding unit 313 to the test circuits. Such minimized wiring is advantageous for reducing the circuit size of the memory device.

In addition, insufficient signal margin which may occur when the PSET signal is latched by the TCLK signal may be avoided by setting a long cycle for the TCLK signal. In other words, the TCLK signal is a test mode clock signal that is separate from the usual clock signal used for the normal operation of the memory device. Thus, even when the memory device operates at high speed with a usual clock signal having short cycles, a separate TCLK signal with longer cycles is used for avoiding insufficient signal margin in the test mode.

Figure 4:
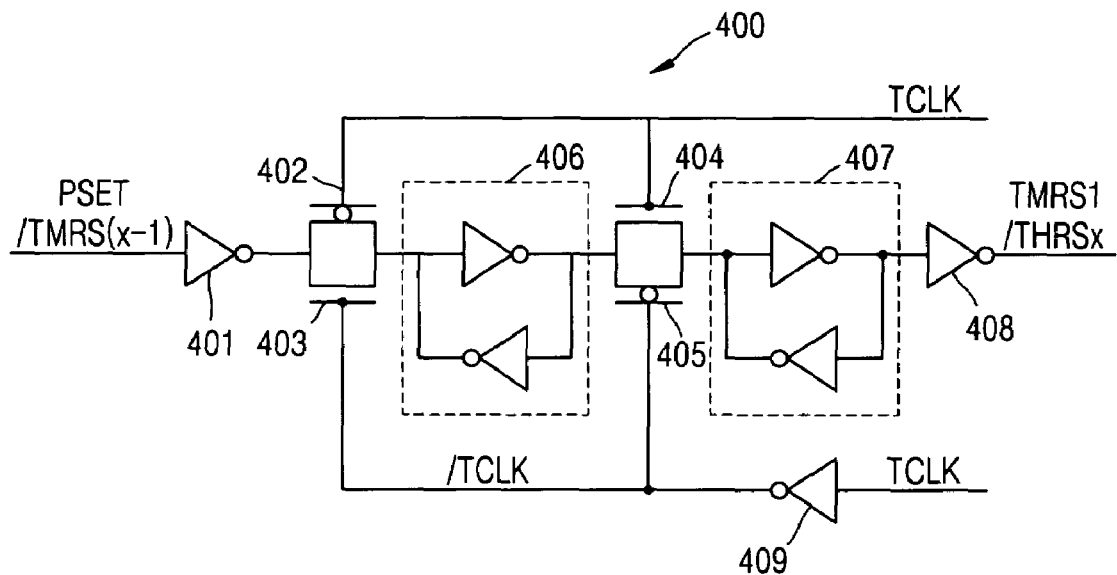
FIG. 4 is a circuit diagram of a test mode signal generating unit according to an embodiment of the present invention.

FIG. 4 is a circuit diagram of an example implementation 400 for one of the test mode signal generating units 331 in FIG. 3, according to an embodiment of the present invention. Referring to FIG. 4, the example test mode signal generating unit 400 includes a first inverter 401 having the PSET signal applied at its input and a second inverter 409 having the TCLK signal applied at its input.

The test mode signal generating unit 400 further includes a PMOS transistor 402 and an NMOS transistor 404 both having gates with the TCLK signal applied thereon. The test mode signal generating unit 400 also includes an NMOS transistor 403 and a PMOS transistor 405 both having gates with an inverted TCLK signal applied thereon.

The drains of the PMOS and NMOS transistor 402 and 403 are coupled together, and the sources of the PMOS and NMOS transistor 402 and 403 are coupled together. Likewise, the drains of the PMOS and NMOS transistor 404 and 405 are coupled together, and the sources of the PMOS and NMOS transistor 404 and 405 are coupled together. Thus, the PMOS and NMOS transistors 402, 403, 404, and 405 function as transmission gates.

The test mode signal generating unit 400 further includes first and second latch circuits 406 and 407 and a third inverter 408 inverting an output of the second latch circuit 407 to generate a test mode signal. When the PSET signal is applied at the input of the first inverter 401, the output of the third inverter 408 is the first test mode signal TMRS1. Alternatively, when a previous test mode signal TMRS(x−1) from a previous test mode signal generating unit is applied at the input of the first inverter 401, the output of the third inverter 408 is the next test mode signal TMRSx in the sequential generation of the test mode signals TMRS1 through TMRSn.

Each of the first and second latch circuits 406 and 407 includes two inverters in one embodiment of the present invention. In such latch circuits 406 and 407, the input terminal of each of the inverters is attached to the output terminal of the other inverter.

Figure 5:
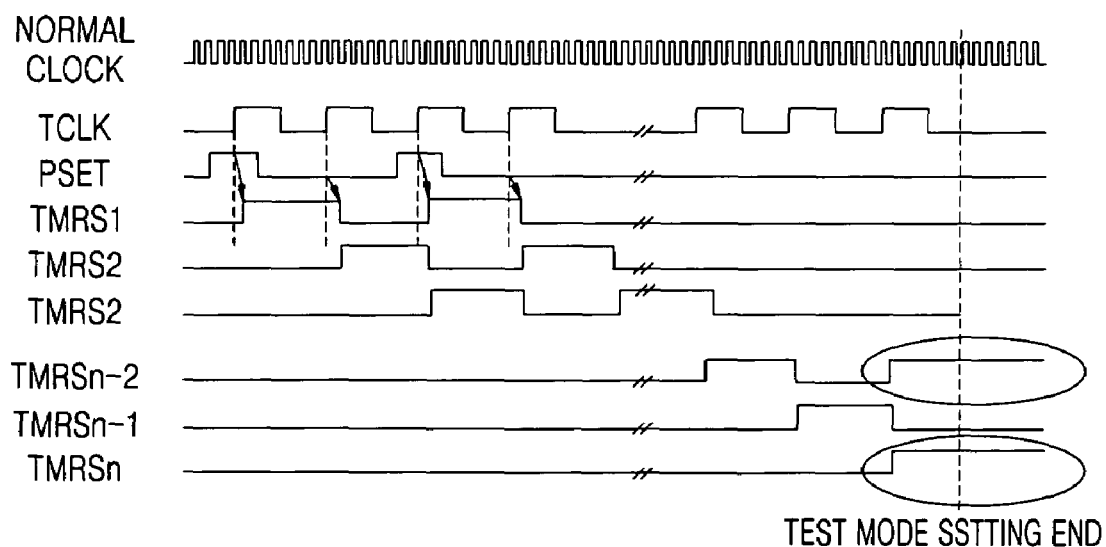
FIG. 5 is a timing diagram of signals generated by the test mode signal generating circuit of FIG. 3.

FIG. 5 is a timing diagram of signals during operation of the test mode signal generating circuit 300 of FIG. 3 when each test mode signal generating unit 331 is implemented similarly as illustrated in FIG. 4. The operation of the test mode signal generating unit 400 of FIG. 4 according to the present invention will now be described with reference to FIGS. 3, 4, and 5. In the normal mode, the memory device operates in synchronization with a normal clock signal that has relatively short cycles.

However, when the memory device operates in the test mode, the TMSET signal is generated and activated such that the TCLK signal is input via the CKE input unit 322. In addition, the PSET signal is input to the first test mode signal generating unit 331 (i.e., the left-most test mode signal generating unit 331 in FIG. 3) via the DQM input unit 321.

If the TCLK signal is logic "low," the PMOS transistor 402 and the NMOS transistor 403 are turned on, and the NMOS transistor 404 and the PMOS transistor 405 are turned off. Thus, the PSET signal is stored in the first latch circuit 406. Then, if the TCLK signal transits from logic "low" to logic "high," the PMOS transistor 402 and the NMOS transistor 403 are turned off, and the NMOS transistor 404 and the PMOS transistor 405 are turned on. Thus, the PSET signal stored in the first latch circuit 406 is transmitted to the second latch circuit 407, inverted by the third inverter 408, and then output as the first test mode signal TMRS1.

In other words, referring to FIG. 5, when the TCLK signal transits to logic high, a test mode signal becomes logic high or low depending on the state of the PSET signal. When a previous test mode signal (TMRS(x−1)) is received by a subsequent test mode signal generating unit 331 in the series connection, the subsequent test mode signal generating unit 331 generates a subsequent test mode signal (TMRSx).

In this manner, a test mode signal generating circuit of a memory device generates the test mode signals with minimized wiring thereby reducing the area of the memory device. In addition, even when the memory device normally operates at higher speed, the memory device operates in the test mode with a sufficient signal margin by using a separate test mode clock signal TCLK.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A memory device comprising:
   a plurality of test mode signal generating units; and
   a plurality of test circuits, wherein each test mode signal generating unit generates a respective test mode signal for a respective test circuit;
   and wherein the test mode signal generating units generate the test mode signals in series for the test circuits.

2. The memory device of claim 1, wherein each test mode signal generating unit is disposed within a respective test circuit.

3. The memory device of claim 1, wherein the plurality of test mode signal generating units includes:
a first test mode signal generating unit with means for generating a respective test mode signal from a test mode setting signal and a test mode latch clock signal.

4. The memory device of claim 3, wherein the plurality of test mode signal generating units includes:
at least one subsequent test mode signal generating unit with means for generating a respective test mode signal from a previous test mode signal and the test mode latch clock signal.

5. The memory device of claim 1, further comprising:
a test mode entry signal generator for generating a test mode entry signal for indicating that the memory device operate in a test mode in response to address and command signals.

6. The memory device of claim 5, further comprising:
an input controller for generating a test mode latch clock signal and a test mode setting signal when the test mode entry signal indicates that the memory device operate in the test mode,
wherein the test mode signal generating units generate the test mode signals in response to the test mode latch clock signal and the test mode setting signal.

7. The memory device of claim 6, wherein the input controller includes:
a first switch for switching the test mode setting signal from a first input pin to the test mode signal generating units when the test mode entry signal indicates that the memory device operate in the test mode; and
a second switch for switching the test mode latch clock signal from a second input pin to the test mode signal generating units when the test mode entry signal indicates that the memory device operate in the test mode.

8. A memory device comprising:
a test mode entry signal generator for generating a test mode entry signal for indicating that the memory device operate in a test mode in response to address and command signals;
an input controller for generating a test mode latch clock signal and a test mode setting signal when the test mode entry signal indicates that the memory device operate in the test mode; and
a plurality of test mode signal generating units for generating test mode signals in series in response to the test mode latch clock signal and the test mode setting signal.

9. The memory device of claim 8, further comprising:
a plurality of test circuits, wherein each test mode signal generating unit generates a respective test mode signal for a respective test circuit.

10. The memory device of claim 9, wherein each test mode signal generating unit is disposed within a respective test circuit.

11. The memory device of claim 8, wherein the plurality of test mode signal generating units includes:
a first test mode signal generating unit with means for generating a respective test mode signal from the test mode setting signal and the test mode latch clock signal.

12. The memory device of claim 11, wherein the plurality of test mode signal generating units includes:
at least one subsequent test mode signal generating unit with means for generating a respective test mode signal from a previous test mode signal and the test mode latch clock signal.

13. The memory device of claim 8, wherein the input controller includes:
a first switch for switching the test mode setting signal from a first input pin to the test mode signal generating units when the test mode entry signal indicates that the memory device operate in the test mode; and
a second switch for switching the test mode latch clock signal from a second input pin to the test mode signal generating units when the test mode entry signal indicates that the memory device operate in the test mode.

14. A method for testing within a memory device, comprising:
generating a plurality of test mode signals in series through a plurality of test mode signal generating units; and
using a respective test mode signal from a respective test mode signal generating unit within each of a plurality of test circuits.

15. The method of claim 14, wherein each test mode signal generating unit is disposed within a respective test circuit.

16. The method of claim 14, further comprising:
generating a first test mode signal from a test mode setting signal and a test mode latch clock signal.

17. The method of claim 16, further comprising:
generating a subsequent test mode signal from a previous test mode signal and the test mode latch clock signal.

18. The method of claim 14, further comprising:
generating a test mode entry signal for indicating that the memory device operate in a test mode in response to address and command signals.

19. The method of claim 18, further comprising:
generating a test mode latch clock signal and a test mode setting signal when the test mode entry signal indicates that the memory device operate in the test mode; and
generating the test mode signals in response to the test mode latch clock signal and the test mode setting signal.

20. The method of claim 19, further including:
switching the test mode setting signal from a first input pin to the test mode signal generating units when the test mode entry signal indicates that the memory device operate in the test mode; and
switching the test mode latch clock signal from a second input pin to the test mode signal generating units when the test mode entry signal indicates that the memory device operate in the test mode.

* * * * *